United States Patent
Railkar et al.

(10) Patent No.: US 8,304,293 B2
(45) Date of Patent: Nov. 6, 2012

(54) THERMALLY ENHANCED SEMICONDUCTOR PACKAGE

(75) Inventors: Tarak A. Railkar, Plano, TX (US); Steven D. Cate, Los Altos, CA (US)

(73) Assignee: Maxim Integrated, Inc., San Jose, CA (US)

( * ) Notice: Subject to any disclaimer, the term of this patent is extended or adjusted under 35 U.S.C. 154(b) by 0 days.

(21) Appl. No.: 13/230,208

(22) Filed: Sep. 12, 2011

(65) Prior Publication Data

US 2012/0003794 A1      Jan. 5, 2012

Related U.S. Application Data

(62) Division of application No. 12/364,452, filed on Feb. 2, 2009, now Pat. No. 8,018,051.

(51) Int. Cl.
*H01L 21/44* (2006.01)
*H01L 21/48* (2006.01)

(52) U.S. Cl. ........ 438/122; 438/123; 438/124; 438/617; 257/E23.051; 257/E21.51

(58) Field of Classification Search .......... 438/122–124, 438/617; 257/E23.051, E21.51
See application file for complete search history.

(56) References Cited

U.S. PATENT DOCUMENTS

| | | | |
|---|---|---|---|
| 5,345,106 A | 9/1994 | Doering et al. | |
| 5,608,267 A * | 3/1997 | Mahulikar et al. | 257/796 |
| 5,650,663 A * | 7/1997 | Parthasarathi | 257/706 |
| 5,929,513 A | 7/1999 | Asano et al. | |
| 6,093,960 A * | 7/2000 | Tao et al. | 257/706 |
| 6,653,730 B2 | 11/2003 | Chrysler et al. | |
| 6,927,096 B2 * | 8/2005 | Shimanuki | 438/113 |
| 7,009,283 B1 | 3/2006 | de Simone et al. | |
| 7,391,153 B2 | 6/2008 | Suehiro et al. | |
| 7,671,453 B2 * | 3/2010 | Hayashi et al. | 257/668 |
| 2001/0045644 A1 | 11/2001 | Huang | |
| 2004/0046241 A1 | 3/2004 | Combs et al. | |
| 2004/0097017 A1 * | 5/2004 | Shimanuki | 438/124 |
| 2004/0113284 A1 * | 6/2004 | Zhao et al. | 257/782 |
| 2004/0226688 A1 | 11/2004 | Fong et al. | |
| 2008/0142937 A1 * | 6/2008 | Chen et al. | 257/675 |

* cited by examiner

*Primary Examiner* — Nitin Parekh
(74) *Attorney, Agent, or Firm* — North Weber & Baugh LLP

(57) ABSTRACT

Disclosed are systems and methods for improving the thermal performance of integrated circuit packages. Aspects of the present invention include improved thermal package structures and methods for producing the same through the application of one or more thermal spreaders in the package. In embodiments, a thermal spreader is incorporated in a semiconductor chip package between a semiconductor die and its die pad. By including a thermal spreader in an IC package, the package can handle higher levels of power while maintaining approximately the same temperature of the package or can reduce the temperature of the package when operating at the same power level, as compared to a package without a thermal spreader.

3 Claims, 10 Drawing Sheets

300

```
┌─────────────────────────────────────┐
│ Form a thermal spreader on the backside of │─ 305
│     the semiconductor die           │
└─────────────────────────────────────┘
                 │
                 ▼
┌─────────────────────────────────────┐
│ Apply an adhesive to the carrier, the thermal │─ 310
│         spreader, or both           │
└─────────────────────────────────────┘
                 │
                 ▼
┌─────────────────────────────────────┐
│ Place the semiconductor die with the thermal │─ 315
│      spreader onto the carrier      │
└─────────────────────────────────────┘
                 │
                 ▼
┌─────────────────────────────────────┐
│     If necessary, cure the adhesive │─ 320
└─────────────────────────────────────┘
```

- 505: Form a thermal spreader on the top surface of a carrier
- 510: Apply an adhesive to the top surface of the thermal spreader, the bottom surface or the semiconductor die, or both
- 515: Place the semiconductor die onto the carrier that includes the thermal spreader
- 520: If necessary, cure the adhesive

FIGURE 5

THERMALLY ENHANCED SEMICONDUCTOR PACKAGE

CROSS REFERENCE TO RELATED PATENT APPLICATIONS

This application is a divisional of and claims priority to U.S. patent application Ser. No. 12/364,452, entitled "Thermally Enhanced Semiconductor Package," filed Feb. 2, 2009 now U.S. Pat. No. 8,018,051.

BACKGROUND

A. Technical Field

The present invention relates generally to systems and methods for integrated circuit ("IC") packaging. And, the present invention relates more particularly to systems and methods for improving the thermal performance of integrated circuit package solutions.

B. Background of the Invention

Integrated circuits, also referred to chips, microchips, or semiconductor dies, are fragile and susceptible to many factors, such as mechanical stresses, chemical stresses, and thermal stresses. Prior to being used in an electronic system, an integrated circuit must be packaged to help minimize the impact of these stress factors. Packaging helps protect against mechanical stresses by providing structural support to the integrated circuit. By encapsulating the integrated circuit in a package, the integrated circuit is protected against environmental factors such as dust, moisture, and other items that could cause chemical stress or otherwise affect the circuit. However, the addition of material around the integrated circuit from the packaging can increase the thermal resistance and thereby increase thermal stresses on the chip. These thermal stresses can reduce the reliability of the integrated circuit and, in some cases, can result in its catastrophic failure.

FIG. 1 depicts a conventional semiconductor package. Shown in FIG. 1 is a lead-frame package semiconductor chip 100 comprising a semiconductor die 110 on a chip carrier 140, which may also be referred to as a die pad, paddle, or support. The semiconductor die 110 is typically attached to the die pad 140 via an adhesive 170, which may be an epoxy or an adhesive tape. The wire bonds 160 provide electrical connections from the integrated circuit 110 to the lead-frame bond fingers or pads 120. The die 110, die pad 140, and lead-frame bond fingers 120 (or at least a portion of the lead-frame bond fingers) are typically encapsulated in a mold material 150.

The power used during the operation of the circuit generates heat. When inside a package, the thermal resistance created by the packaging can inhibit the chip's ability to dissipate this generated heat. The thermal issues become more acute with increasing levels of power dissipation. The thermal issue is further compounded by advances in semiconductor integrated circuit design and manufacturing that have produced increasingly smaller and more powerful chips. As integrated circuits increase in both power used and processing speed, the heat generated also increases. Furthermore, as an integrated circuit decreases in size, the power density and heat density also increases. These thermal issues amplify the possibilities of decreased chip performance and failure due to excess heat.

SUMMARY OF THE INVENTION

Given the above drawbacks, an objective of the present invention is to provide improved thermal package structures and methods for manufacturing the same, through the application of one or more thermal spreaders embedded inside the package. In embodiments, a thermal spreader is incorporated in a semiconductor package between a semiconductor die and its support, which may also be referred to herein as a carrier, a substrate, or a die pad. In embodiments, the die thickness may be suitably reduced so that the overall package thickness remains unchanged relative to corresponding conventional packages. Higher levels of heat spreading accomplished through integration of the thermal spreader help the chip function at cooler temperatures.

Another object of the present invention is to provide die shrink possibilities and possibilities of enhancing package level integration. Because the thermally enhanced package is able to handle higher power densities, the die may be shrunk and still operated within thermal limits. In embodiments, one or more of the specifications of a thermally enhanced semiconductor package can remain constant relative to a non-thermally enhanced semiconductor package (such as package dimension and function), thereby sparing a customer of the chip package from any major changes to its application board or manufacturing process.

Yet another object of the present invention is to facilitate possibilities of smaller package footprints than that of the conventional packages. In embodiments, the improved thermal performance created by the introduction of one or more thermal spreaders allows for the reduction of die size, semiconductor packages with a smaller footprint but the same or improved performance can be produced. By leveraging a die size reduction through an advanced silicon (or other semiconductor) technology as well as leveraging the package thermal enhancements through the use of an integrated thermal spreader, a chip developer can provide semiconductor packages with the same or improved performance but with a smaller form factor. As products move toward smaller form factors, being able to produce chips with smaller sizes can provide the end user with significant space savings at a system- or sub-system level.

In embodiments, a semiconductor package includes a semiconductor die, a carrier which supports the semiconductor die, and a thermal spreader between the semiconductor die and the carrier. The thermal spreader is configured to have a thermal conductivity that is higher than the carrier's thermal conductivity.

In embodiments, the thermal spreader may be integrated with the semiconductor die, integrated with the carrier, or integrated with both the semiconductor die and the carrier. In embodiments, the thermal spreader is a separate component interposed between the semiconductor die and the carrier. The thermal spreader may be affixed between the semiconductor die and the carrier using an adhesive, or alternatively, the thermal spreader may also acts as an adhesive.

A thermal spreader may be employed in a multitude of semiconductor chip configurations including, without limitation, side-by-side, stacked, and hybrid configurations.

Also disclosed herein are methods for producing semiconductor packages that include one or more thermal spreaders. In embodiments, a method for thermally enhancing a semiconductor package involves including a thermal spreader between the integrated circuit and the die pad for the integrated circuit, wherein the thermal spreader has a thermal conductivity that is higher than the support's thermal conductivity. It should be noted that the placement of the thermal spreader between the integrated circuit and the die pad could also include additional items between the integrated circuit and the die pad.

In embodiments, including a thermal spreader between the integrated circuit and the die pad may involve integrating the thermal spreader with the integrated circuit, integrating the thermal spreader with the die pad, or both. In embodiments, the thermal spreader may be a separate component that is placed between the integrated circuit and the die pad. The thermal spreader may be affixed using an adhesive; or alternatively, the thermal spreader may also acts as an adhesive.

Certain features and advantages of the invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 3 depicts a method for producing a semiconductor package as illustrated in FIG. 2 according to embodiments of the present invention.

FIG. 5 depicts a method for producing a semiconductor package as illustrated in FIG. 4 according to embodiments of the present invention.

DETAILED DESCRIPTION OF THE PREFERRED EMBODIMENTS

Figure 1:
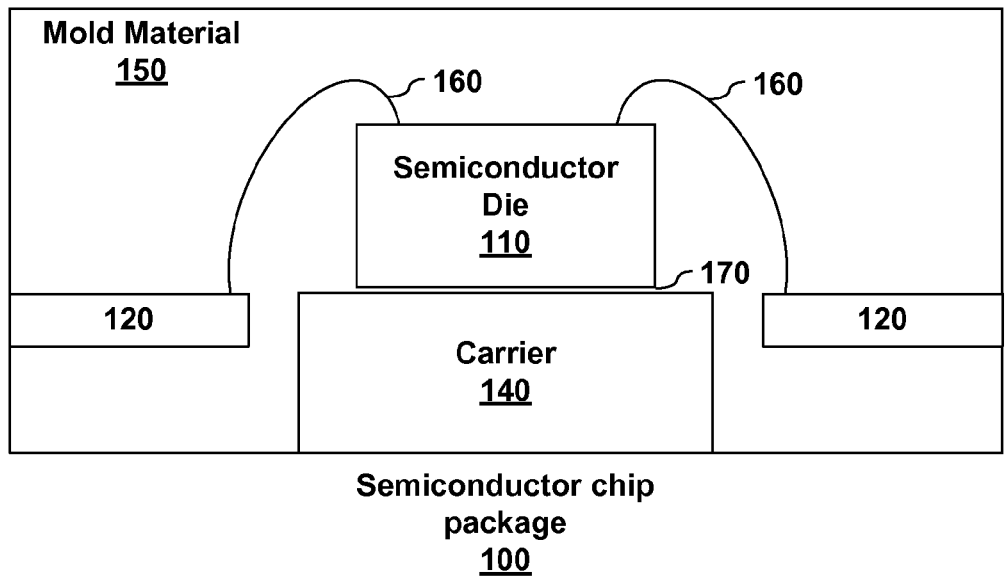
FIG. 1 depicts a conventional semiconductor package.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different systems and devices.

Components shown in block diagrams are illustrative of exemplary embodiments of the invention and are meant to avoid obscuring the invention. It shall also be understood that throughout this discussion that components may be described as separate units, which may comprise sub-units, but those skilled in the art will recognize that, in embodiments, the various components, or portions thereof, may be divided into separate components or may be integrated together.

Furthermore, connections between components within the figures are not intended to be limited to direct connections. Rather, connections between these components may be through one or more intermediary components. Also, additional or fewer connections may be used. It shall also be noted that the term "coupled" shall be understood to include direct connections and indirect connections through one or more intermediary components.

Reference in the specification to "one embodiment," "an embodiment," "embodiments," and the like means that a particular feature, structure, characteristic, or function described in connection with the embodiment is included in at least one embodiment and may be in more than one embodiment. The phrases "in embodiments," "in an embodiment," and the like in various places in the specification are not necessarily all referring to the same embodiment or embodiments.

It shall be noted that the examples provided herein are provided by way of illustration and not limitation. Although the inventive concepts are described in reference to a leadframe based IC package, aspects of the present invention can be applied to other IC packages that use wire-bond as the means of connecting the semiconductor die to its carrier. One skilled in the art shall recognize that the present invention can be applied to other situations, including without limitation to other package types.

A. Overview

There is increasing demand for packages to have better thermal performance. This increasing demand arises for at least two reasons. First, the functionality on the die itself is increasing, which causes the die to consume more power and dissipate more heat. Therefore, it becomes important to maintain the die temperature inside the package below a specified threshold for performance purposes. Also, rarely in an integrated circuit is the heat generation and heat dissipation uniformly distributed across the semiconductor die piece. Rather, localized hot spots exist, which produce more heat than other areas on the semiconductor. If the heat of these hot spots is not adequately addressed, the integrated circuit may have reduced performance or even fail. Second, there is continual demand for smaller and denser integrated circuits. As integrated circuits decrease in size and increase in functionality, the power density and heat density of these chips increases. Also, as the semiconductor die shrinks, the die pad's effectiveness is reduced because there is less surface interaction between the die and the die pad. These thermal issues amplify the possibilities of decreased chip performance and failure due to excess heat.

Aspects of the present invention facilitate the thermal enhancement of packaged integrated circuits. By including at least one thermal spreader between a semiconductor die and its die-paddle, between semiconductor dies, or both, the thermal capabilities of a semiconductor package can be improved over traditional packaging, such as that shown in FIG. 1. The thermal spreader takes the heat from the die, distributes it, and can leverage the traditional approach of removing heat through the die-paddle. Employing a thermal spreader also minimizes hot spots and helps the device handle high levels of power. Also, as the semiconductor die shrinks, the thermal spreader helps maintain or even increase the die pad's effectiveness by increasing the thermal interaction between the die and the die pad. Thus, heat spreading accomplished through the integration of a thermal spreader can help a chip function at cooler temperatures and can also help prevent or minimize localized hot spots.

In embodiments, the thermal spreader has a thermal conductivity (K) that is higher than that of the carrier material. Thermal conductivity (typically measured in watt per meter kelvin, W/(m·K)) is a measure of the ability of a material to conduct or transfer heat. In embodiments, the thermal spreader has a thermal conductivity that is higher than that of the carrier material and higher than that of semiconductor die, which may be silicon or some other semiconductor material or materials.

One skilled in the art shall recognize that the thermal spreader is not an extension of a thermal epoxy. The primary role of an epoxy is to hold the die in place and its secondary function is to minimize thermal resistance—principally by reducing air pockets which can act as insulators. The primary purposes of a thermal spreader are to conduct heat away from the semiconductor die and to also help distribute that heat evenly across the die.

A thermal spreader is also fundamentally different from a heat sink. A thermal spreader is designed to have a high thermal conductivity. The spreader is configured to take heat generated by the semiconductor die, which heat is likely to be unevenly distributed, and to quickly spread that heat across the entire thermal spreader. In embodiments, the thermal spreader takes the heat generated by the integrated circuit, makes it more even, and leverages the traditional approach of removing heat through the carrier. This approach minimizes hot spots and helps the device handle higher levels of power than could be handled in the absence of a thermal spreader. A heat sink is configured to have a high heat capacity. That is, a heat sink is configured to act as a thermal reservoir—taking or removing a large amount of heat before its temperature increases. On the contrary, a thermal spreader is good at accepting and spreading the heat—a thermal spreader is configured to change temperature and to change temperature quickly. The thermal spreader is not a primary means to dissipate the generated heat, but rather a means to help smooth the thermal profile and to help conduct the heat to the carrier. One skilled in the art will recognize that much of the generated heat is removed through heat conducted through the thermal die pad. Thus, a thermal spreader may acts as a complement to a heat sink. Also, heat sinks typically are implemented at a system level, not at a package level.

Presented herein are improved thermal package structures, and methods for producing the same, which involve the application of one or more thermal spreaders in the package.

B. Thermal Spreader as Part of the Semiconductor Die

Figure 2:
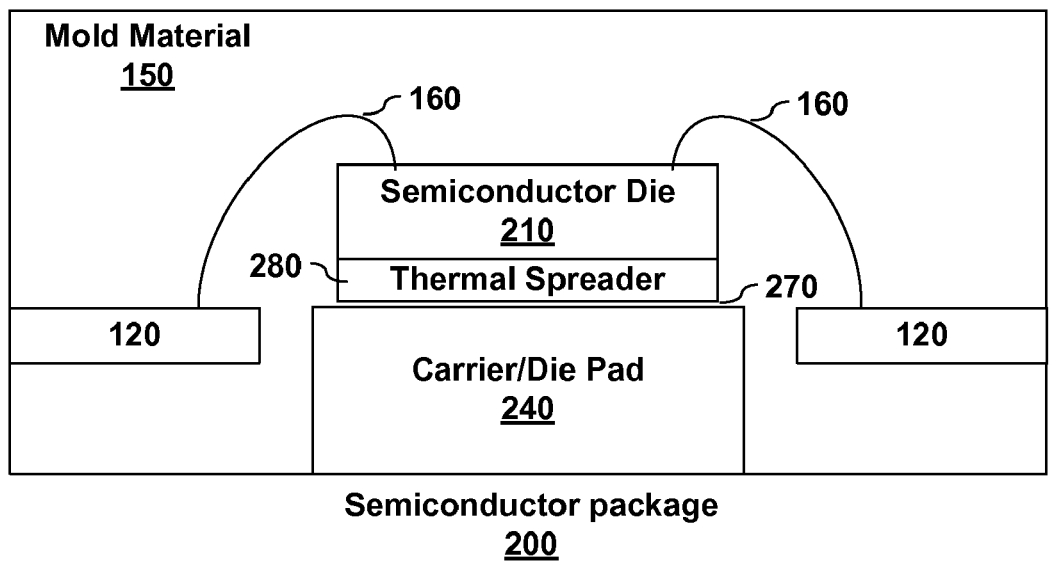
FIG. 2 depicts an embodiment of a package for an integrated circuit that includes a thermal spreader according to embodiments of the present invention.

FIG. 2 depicts an embodiment of a package 200 for an integrated circuit 210 that includes a thermal spreader 280 according to embodiments of the present invention in order to enhance the thermal performance of the package. Illustrated in FIG. 2 is a semiconductor chip 200 that includes a semiconductor die 210 on a carrier 240. Between the semiconductor die 210 and the carrier 240 is a thermal spreader 280. The wire bonds 160 provide electrical connections from the active side of the integrated circuit 210 to the bond fingers 120. One skilled in the art shall recognize that the package may contain multiple wire bonds 160 and bond fingers 120, but only a small number are depicted to simplify the illustration. The die 210, carrier 240, and bond fingers 120 (or at least a portion of the bond fingers) are encapsulated in a mold material 150. In the embodiment depicted in FIG. 2, the semiconductor die 210 and thermal spreader 280 may be attached to the carrier 240 using an adhesive 270.

The thermal spreader 280 positioned between the die 210 and the carrier 240 helps improve the thermal performance of the IC package 200, thereby enabling the device to operate at cooler temperature. Because the chip can operate at a lower temperature, it can operate more efficiently than a traditionally packaged integrated circuit.

In the embodiment depicted in FIG. 2, the thermal spreader 280 is a part of the semiconductor die 210. The thermal spreader 280 may be formed as part of the semiconductor die manufacturing process. FIG. 3 depicts a method 300 for producing a semiconductor chip as illustrated in FIG. 2 according to embodiments of the present invention.

As shown in FIG. 3, a thermal spreader layer is grown or otherwise formed (305) on the backside of a semiconductor. The thermal spreader may be added as part of the semiconductor by chemical vapor deposition, plating, sputtering, or the like. The thermal spreader may be added as part of the wafer fabrication and processing or may be added as a post-fabrication process. In embodiments, the semiconductor die with the thermal spreader is cut or diced from the wafer. An adhesive is placed (310) on the carrier, the underside of the thermal spreader, or both. The semiconductor die with the integrated thermal spreader is placed (315) onto the carrier. If necessary, the adhesive used to attach the semiconductor die with the thermal spreader to the carrier may be suitably treated for curing (320). One skilled in the art shall recognize that the addition of a thermal spreader in this embodiment does not cause a deviation from the normal pick-and-place package assembly process of die-attach, thereby making the use of such semiconductor dies easy to implement with existing assembly equipment infrastructure.

C. Thermal Spreader as Part of the Carrier

Figure 4:
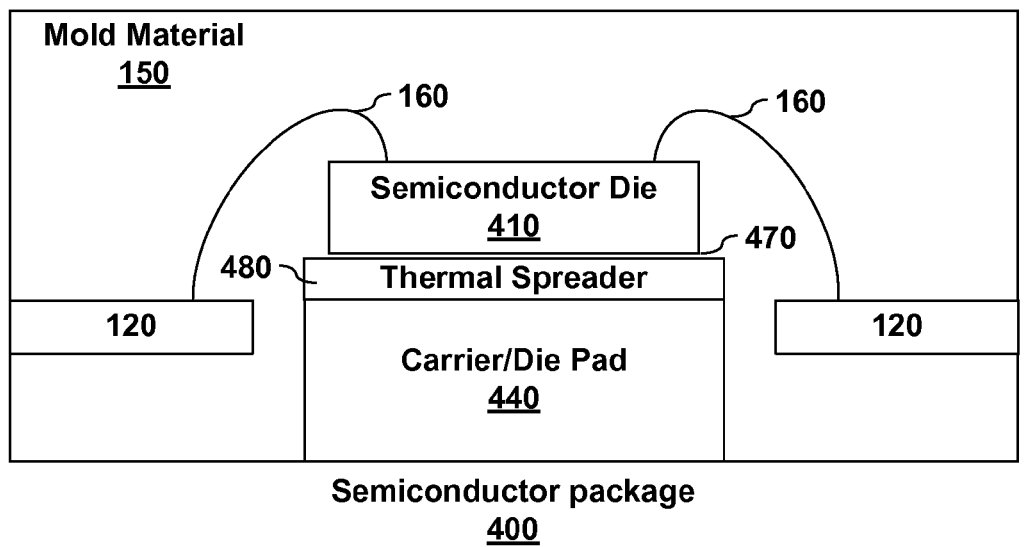
FIG. 4 depicts another embodiment of a package for an integrated circuit that includes a thermal spreader according to embodiments of the present invention.

FIG. 4 depicts an embodiment of a package 400 for an integrated circuit that includes a thermal spreader 480 according to embodiments of the present invention to enhance the thermal performance of the package. Illustrated in FIG. 4 is a semiconductor package 400 comprising a semiconductor die 410 on a carrier 440. Between the semiconductor die 410 and the carrier 440 is a thermal spreader 480. The wire bonds 160 provide electrical connections from the integrated circuit 410 to the bond fingers 120. One skilled in the art shall recognize that the package typically contains multiple wire bonds 160 and bond fingers 120, but only a small number are depicted to simplify the illustration. The die 410, carrier 440, and bond fingers 120 (or at least a portion of the bond fingers) are encapsulated in a mold material 150. In the embodiment depicted in FIG. 4, the thermal spreader 480 may be formed as part of the carrier 440 and may be attached to the semiconductor die 410 using an adhesive 270.

The thermal spreader 480 positioned between the die 410 and the carrier 440 enhances the thermal performance of the package 400, thereby enabling the device to operate at cooler temperature.

In the embodiment depicted in FIG. 4, the thermal spreader 480 is a part of the carrier 440. FIG. 5 depicts a method 500 for producing a semiconductor chip as illustrated in FIG. 4 according to embodiments of the present invention.

As shown in FIG. 5, a thermal spreader layer is grown or otherwise formed (505) on the top surface of a carrier. The thermal spreader may be added as part of the carrier by plating, chemical vapor deposition, plating, sputtering, or the like. In embodiments, an adhesive is placed (510) on the top surface of the thermal spreader, the underside of the semiconductor die, or both. The semiconductor die is placed (515)

onto the thermal spreader and carrier. If necessary, the adhesive used to attach the semiconductor die to the carrier with the thermal spreader is cured (520). In embodiments, the thermal spreader may be made of a material that allows it to also act as an adhesive by affixing the die to the carrier.

D. Thermal Spreader as a Separate Component

Figure 6:
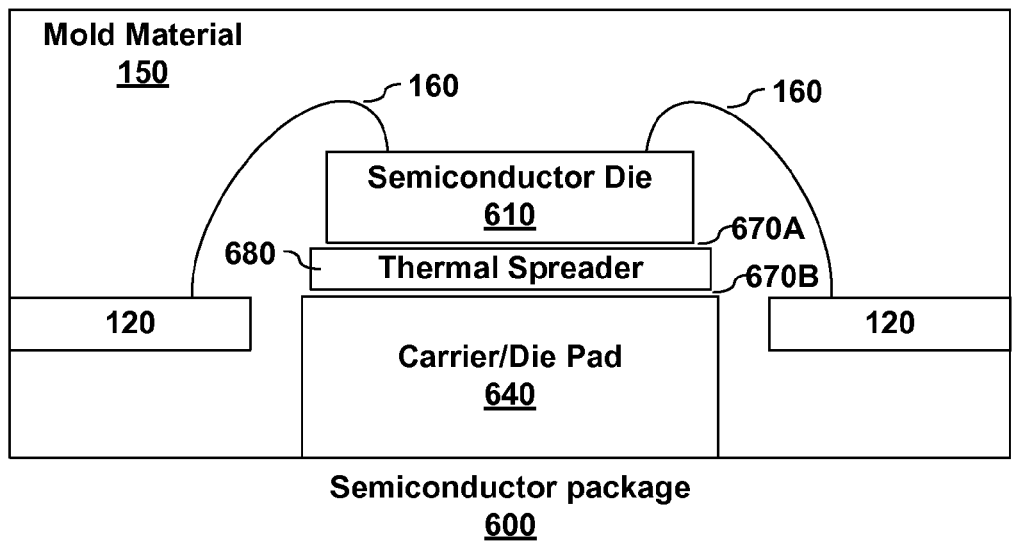
FIG. 6 depicts another embodiment of a package for an integrated circuit that includes a thermal spreader according to embodiments of the present invention.

FIG. 6 depicts an embodiment of a package 600 for an integrated circuit 610 that includes a thermal spreader 680 according to embodiments of the present invention in order to enhance the thermal performance of the package. Illustrated in FIG. 6 is a semiconductor package 600 comprising a semiconductor die 610 on a carrier 640. Between the semiconductor die 610 and the carrier 640 is a thermal spreader 680. The wire bonds 160 provide electrical connections from the active surface of the integrated circuit 610 to the bond fingers 120. One skilled in the art shall recognize that the package typically contains multiple wire bonds 160 and bond fingers 120, but only a small number are depicted to simplify the illustration. The die 610, carrier 640, and bond fingers 120 (or at least a portion of the bond fingers) are encapsulated in a mold material 150. In the embodiment depicted in FIG. 6, the thermal spreader 680 is a separate component from both the semiconductor die 610 and the carrier 640. In embodiments, the thermal spreader may be interposed between the semiconductor die 610 and the carrier 640 and held in place by an adhesive or adhesives 270A and 270B. In embodiments, the adhesives used at the interfaces may be the same or different.

The thermal spreader 680 positioned between the die 610 and the carrier 640 helps improve the thermal performance of the IC package, thereby enabling the device to operate at cooler temperature.

Figure 7:
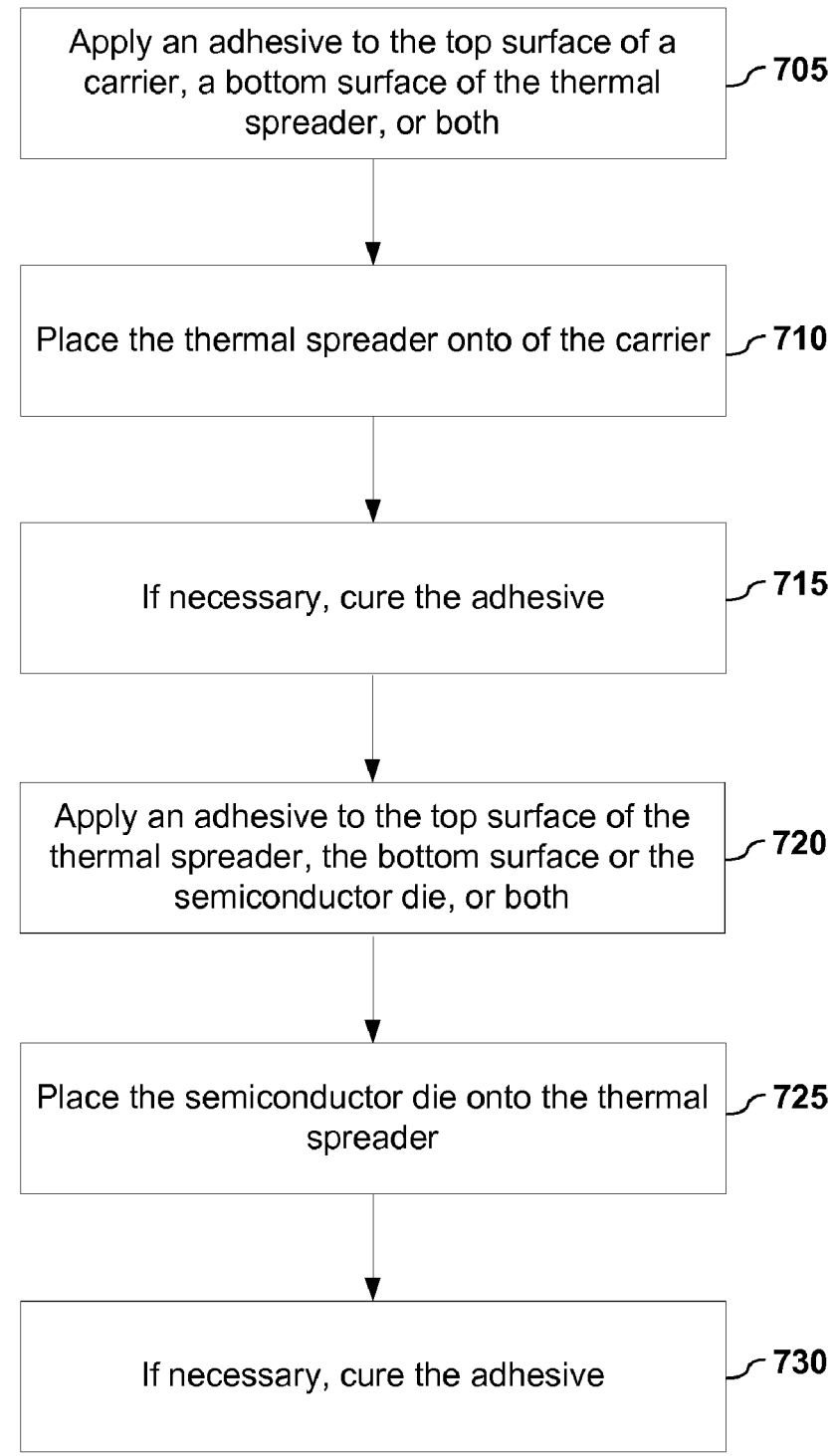
FIG. 7 depicts a method for producing a semiconductor package as illustrated in FIG. 6 according to embodiments of the present invention.

In the embodiment depicted in FIG. 6, the thermal spreader 680 is a separate component. FIG. 7 depicts a method 700 for producing a semiconductor chip package as illustrated in FIG. 6 according to embodiments of the present invention.

As shown in FIG. 7, in embodiments, an adhesive is placed (705) on the top surface of the carrier, the underside of the thermal spreader, or both. The thermal spreader is placed (710) onto the carrier. If necessary, the adhesive used to attach the thermal spreader to the carrier is cured (715). In embodiments, an adhesive is placed (720) on the top surface of the thermal spreader, the underside of the semiconductor die, or both. The semiconductor die is placed (725) onto the thermal spreader and carrier. If necessary, the adhesive used to attach the semiconductor die to the thermal spreader on the carrier is cured (730).

One skilled in the art shall recognize that the addition of a thermal spreader in this embodiment follows the standard pick-and-place assembly process; however, the process is simply repeated once. The first time the process is performed the thermal spreader is being placed onto the carrier, and the second time the process is performed the semiconductor die is placed onto the carrier and thermal spreader. Thus, implementation of thermal spreaders into existing packaging processes can be accomplished easily.

One skilled in the art shall recognize that this method may be performed in different orders. For example, the thermal spreader may be first attached to the semiconductor die and the combined die and spreader may be placed on the carrier.

E. Configuration Embodiments

One skilled in the art shall recognize that a number of permutations exists that can utilize at least one thermal spreader and that these permutations fall within the scope of the present invention. Furthermore, it shall be noted that the application of a thermal spreader may be used on a variety of package, such as by way of example and not limitation, leadframe based packages and substrate-based packages (such as, laminate, ceramic, and other materials).

By way of illustration and not limitation, presented herein are some embodiments of configurations using at least one thermal spreader. One skilled in the art shall recognize that thermal spreaders may be implemented in variety ways and configurations. It shall also be noted that the thermal spreader may be part of a semiconductor die, part of a carrier, a separate component, or a combination thereof.

1. Stacked Embodiments

Figure 8:
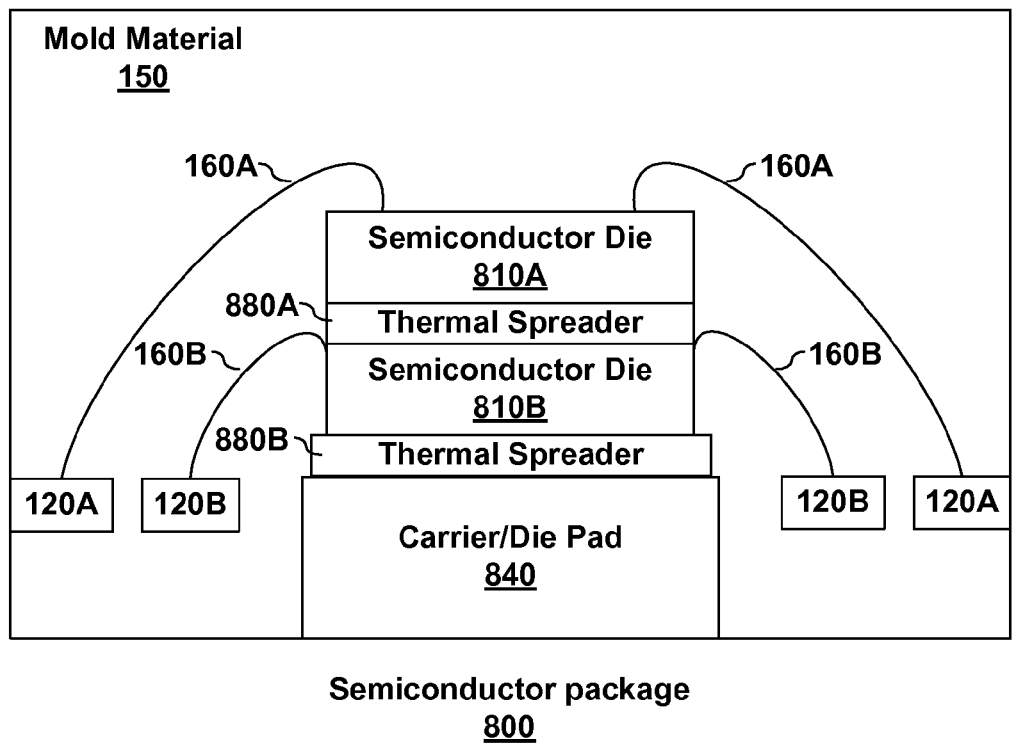
FIG. 8 depicts another embodiment of a package for an integrated circuit that includes at least one thermal spreader according to embodiments of the present invention.

FIG. 8 depicts another embodiment of a package for an integrated circuit that includes at least one thermal spreader according to embodiments of the present invention. Illustrated in FIG. 8 is a semiconductor package 800 that has a set of stacked semiconductor dies 810A and 810B on a carrier 840. The wire bonds 160A and 160B provide electrical connections from the integrated circuit 810A and 810B (respectively) to the bond fingers 120A and 120B (respectively). One skilled in the art shall recognize that the package typically contains multiple wire bonds and bond fingers, but only a small number are depicted to simplify the illustration. The die 810A and 810B, carrier 840, and bond fingers 120 (or at least a portion of the bond fingers) are encapsulated in a mold material 150.

A thermal spreader 880B is positioned between the bottom semiconductor die 810B and the carrier 840. This thermal spreader helps facilitate the heat transfer to the carrier 840. In the depicted embodiment, a thermal spreader 880A is located between the top semiconductor die 810A and the bottom semiconductor die 810B. Thermal spreader 880A helps evenly distribute heat, which helps minimize the effects of hot spots between the stacked dies. In an alternative embodiment, a thermal spreader may not be located between the top semiconductor die 810A and the bottom semiconductor die 810B.

In embodiments, the thermal spreader 880A may be a separate component, incorporated with the semiconductor die 810A, or incorporated with the semiconductor die 810B. In embodiments, the thermal spreader interposed between the semiconductor die 810B and the carrier 840 may be a separate component, incorporated with the semiconductor die 810B, or incorporated with the carrier 840. An adhesive may be used between interfaces. It should be noted that the adhesive may be electrically conducting or may be insulating. In embodiments, the adhesives used at the different interfaces may be the same or different. It should also be noted that the material composition of the thermal spreaders 880A and 880B may be identical or different.

2. Side-by-Side Embodiments

Figure 9:
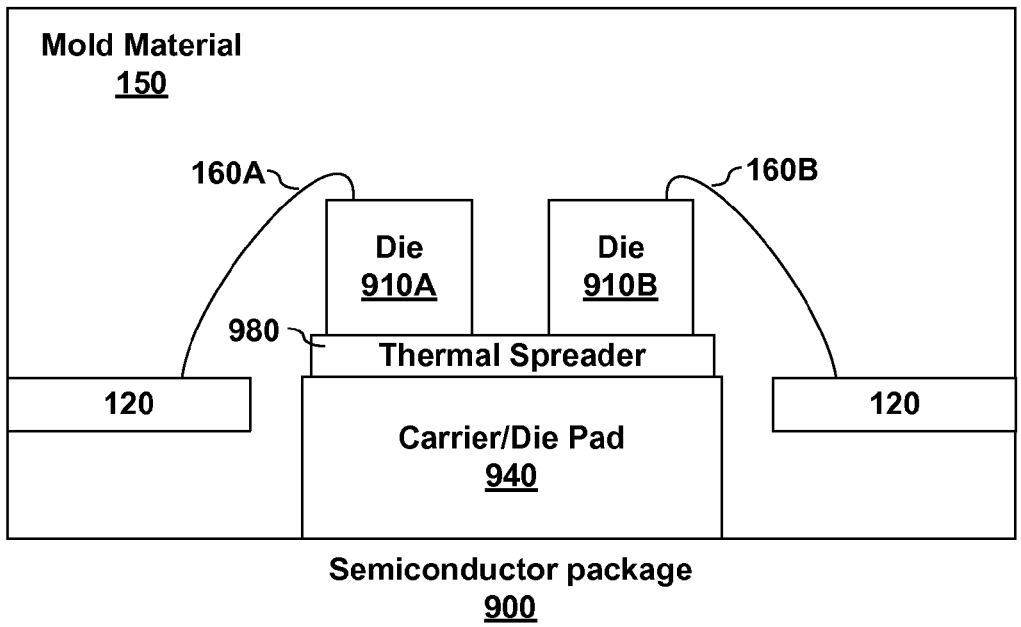
FIG. 9 depicts another embodiment of a package for an integrated circuit that includes at least one thermal spreader according to embodiments of the present invention.

FIG. 9 depicts another embodiment of a package for an integrated circuit that includes at least one thermal spreader according to embodiments of the present invention. As shown in FIG. 9, the semiconductor package 900 includes a set of side-by-side semiconductor dies 910A and 910B on a carrier 940. The wire bonds 160A and 160B provide electrical connections from the integrated circuit 910A and 910B (respectively) to the bond fingers 120. One skilled in the art shall recognize that the package typically contains multiple wire bonds and bond fingers, but only a small number are depicted to simplify the illustration. The dies 910A and 910B, carrier 940, and bond fingers 120 (or at least a portion of the bond fingers) are encapsulated in a mold material 150.

In the embodiment shown in FIG. 9, a single thermal spreader 980 is positioned between the bottoms of the semiconductor dies 910A and 910B and the carrier 940. This thermal spreader helps spread the heat from the dies 910A and 910B and helps transfer the heat to the carrier 940. In the depicted embodiment, a thermal spreader 980 may be a separate component or may be incorporated with the carrier 940. An adhesive may be used between interfaces. It should be noted that the adhesive may be electrically conducting or may be insulating. In embodiments, the adhesives used at the different interfaces may be the same or different.

Figure 10:
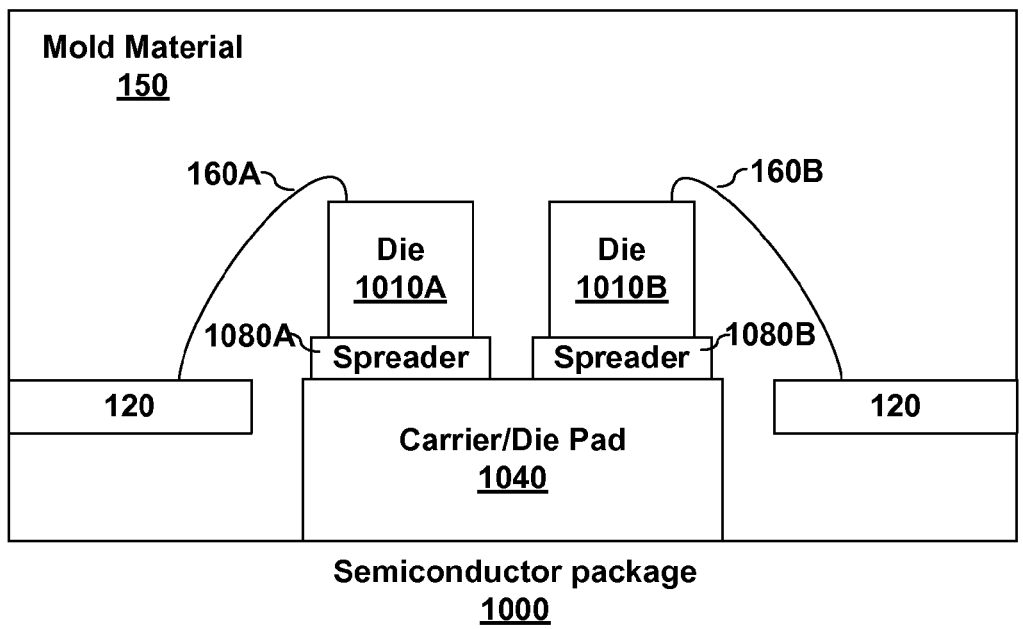
FIG. 10 depicts yet another embodiment of a package for an integrated circuit that includes at least one thermal spreader according to embodiments of the present invention.

FIG. 10 depicts an alternative embodiment of a side-by-side integrated circuit package that includes at least one thermal spreader according to embodiments of the present invention. Similar to the side-by-side configuration shown in FIG. 9, the embodiment depicted in FIG. 10 illustrates a semiconductor package 1000 with a set of side-by-side semiconductor dies 1010A and 1010B on a carrier 1040 that are wire bonded by wire bonds 160A and 160B (respectively) to the bond fingers 120. One skilled in the art shall recognize that the package typically contains multiple wire bonds and bond fingers, but only a small number are depicted to simplify the illustration. It should be noted, however, that a separate thermal spreader 1080A and 1080B is positioned between each of the semiconductor dies 1010A and 1010B (respectively). In yet another alternative embodiment, only one of the dies 1010A and 1010B may have a thermal spreader between it and the carrier 1040.

In the depicted embodiment, the thermal spreaders 1080A and 1080B may be separate components, may be incorporated into the die 1010A or 1010B, may be incorporated with the carrier 1040, or a combination thereof. An adhesive may be used between interfaces to secure the components. It should be noted that the adhesive may be electrically conducting or may be insulating. In embodiments, the adhesives used at the different interfaces may be the same or different. By way of example and not limitation, the adhesive used for the leftmost die 1010A may be insulating, but the adhesive used for the rightmost die 1010B may be conducting. It should also be noted that the material composition of the thermal spreaders 1080A and 1080B may be the same or different.

3. Hybrid Embodiments

Figure 11:
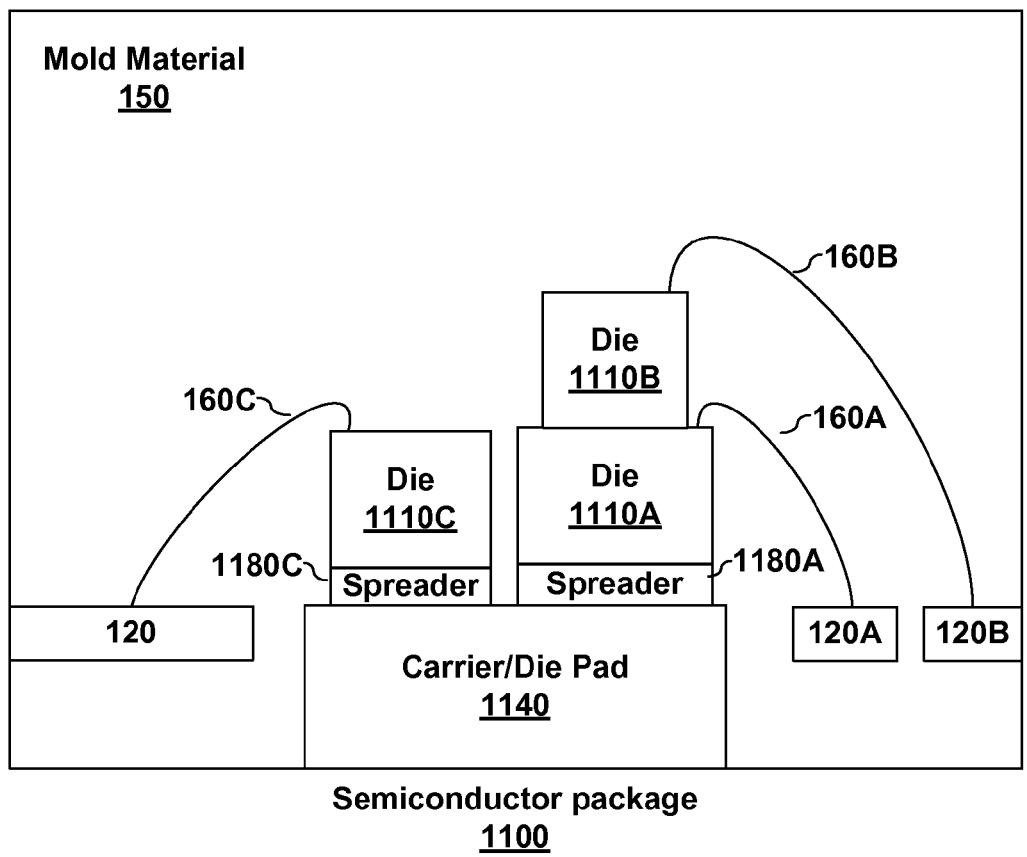
FIG. 11 depicts yet a further embodiment of a package for an integrated circuit that includes at least one thermal spreader according to embodiments of the present invention.

FIG. 11 depicts yet a further embodiment of a package for an integrated circuit that includes at least one thermal spreader according to embodiments of the present invention. FIG. 11 depicts a hybrid configuration that includes both stacked and side-by-side die configurations. The semiconductor package 1100 includes a stacked set of semiconductors 1110A and 1110B that are side-by-side with the semiconductor die 1110C on a carrier 1140. The wire bonds 160A-160C provide electrical connections from the integrated circuit 1110A-1110C (respectively) to the bond fingers 120A-120C (respectively). One skilled in the art shall recognize that the package typically contains multiple wire bonds and bond fingers, but only a small number are depicted to simplify the illustration. The dies 1110A, 1110B, and 1110C, the carrier 1140, and the bond fingers 120 (or at least a portion of the bond fingers) are encapsulated in a mold material 150.

In the embodiment shown in FIG. 11, a thermal spreader 1180A is positioned between the stacked dies 1110A and 1110B and the carrier 1140. And, a thermal spreader 1180C is positioned between the carrier 1140 and a die 1110C that is side-by-side with the stacked dies 1110A and 1110B. In embodiments, the thermal spreaders may be separate components, may be incorporated with the carrier, or may be incorporated with the semiconductor dies, or a combination thereof. An adhesive may be used between interfaces. It should be noted that the adhesive may be electrically conducting or may be insulating. In embodiments, the adhesives used at the different interfaces may be the same or different. It should also be noted that the material composition of the thermal spreaders 1180A and 1180B may be the same or different.

In embodiments, a package may contain one or more substrates or carriers onto which a semiconductor die may be placed. It should be noted that given a package with different carriers, the package may contain different thermal spreaders correlated with the different carriers, different semiconductors placed upon the carriers, or both.

F. Thermal Spreader Materials

One skilled in the art shall recognize that a thermal spreader may be composed of one or more materials and may be made from a number of different materials. In embodiments, a thermal spreader may be made from any material or materials that produce a thermal spreader with a thermal conductivity that is typically higher than that of the substrate on which the semiconductor die is mounted. One skilled in the art shall recognize that the thermal conductivity of the thermal spreader will depend upon the specific requirements. In designing a package and evaluating the maximum die temperature of the package, a designer may consider die characteristics, package characteristics (including the die pad), thermal spreader characteristics, power dissipated in the device, expected operating conditions, and system configuration.

In an embodiment, a thermal spreader may be made from chemical vapor deposited ("CVD") diamond. CVD diamond has a thermal conductivity of approximately 1800 W/(m·K). In addition to CVD diamond, CVD diamond composites, including without limitation CVD diamond composites with metal and/or ceramic, may be used. For example, CVD diamond-copper composites have a thermal conductivity range of approximately 800-1200 W/m·K. Materials with high thermal conductivity, such as gold and silver, may also be used as a thermal spreader.

In addition to many existing materials that can be used, emerging materials with the appropriate thermal conductivity may be used for thermal spreader applications. For example, graphite foam and carbon fibers are two examples of emerging materials that may be used as thermal spreaders. As these materials and other materials continue to be developed, more materials with appropriate thermal conductivity values may be used as thermal spreaders. It should also be noted that, in cases in which the thermal spreader material can act as an adhesive, separate adhesive layer or layers would not be required.

G. Advantages to Using a Thermal Spreader

The present invention, as discussed herein, provides systems and methods for improving the thermal performance of lead-frame based and similar integrated circuit packages by integrating a thermal spreader within an integrated ("IC") package. By introducing a thermal spreader into an IC package, the package can handle higher levels of power while maintaining a constant temperature of the package or can reduce the temperature of the package operating at constant power handling. Thermally cooler packages or packages that handle more power than an equivalent package from a competitor provides a chip producer that uses a thermal spreader in its packaging with a competitive advantage.

In embodiments, to maintain the same thickness, the die thickness may be reduced to compensate for the added thermal spreader. In embodiments, the die thickness may be reduced by back-grinding the device wafer so that the overall package thickness remains unchanged relative to the conventional packages. It should be noted that reducing the thickness of the integrated circuit may also improve the thermal removal and thermal spreading process because much of the heat is generated at the top surface of the die. By reducing the thickness of the semiconductor die, there is less thickness of silicon/semiconductor material for the heat to travel through.

In embodiments, because a thermally enhanced package is able to handle higher power densities, the die may be shrunk and still operated within thermal limits. When the cost addition required for integrating a thermal spreader into the package is less than the cost saved by the cost reduction through reduced size of semiconductor used in the device, a semiconductor chip manufacturer can realize a cost savings. In embodiments, specifications of the package can stay invariant (such as package form, fit, and function), thereby sparing a customer of the chip package from any major changes to its application board or manufacturing process.

Because the improved thermal performance created through the introduction of one or more thermal spreaders allows for the reduction of die size, semiconductor packages with a smaller footprint but the same or improved performance can be produced. By leveraging a die size reduction through an advanced silicon (or other semiconductor) technology as well as leveraging the package thermal enhancements through the use of a thermal spreader, semiconductor packages can be manufactured with the same or improved performance but with a smaller form factor. As products move toward smaller form factors, being able to produce chips with smaller sizes with respect to a competitor can be a significant competitive advantage.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for thermally enhancing a semiconductor package, the method comprising the steps of:
    placing an integrated circuit in a wire-bond-based package, the wire-bond-based package comprising a die pad for the integrate circuit and bonding wires electrically connecting the integrated circuit with respective bonding fingers; forming a thermal spreader between the integrated circuit and the die pad for the integrated circuit, wherein the thermal spreader is integrated within the integrated circuit as a part thereof, the thermal spreader having a thermal conductivity that is higher than the die pad's thermal conductivity; and
    wherein the thermal conductivity of the thermal spreader is higher than 500 W/m·K such that heat generated by the integrated circuit is spread substantially evenly across the thermal spreader, and a molding compound partially encapsulating the die pad, the bonding wires, the bonding fingers and the integrated circuit such that the thermal spreader is completely encapsulated and a bottom surface of the die pad is exposed and is coplanar with that of the molding compound.

2. The method of claim 1 wherein the step of forming a thermal spreader between the integrated circuit and the die pad comprises the step of:
    integrating the thermal spreader with the die pad.

3. The method of claim 2 wherein the step of integrating the thermal spreader with the die pad comprises at least one of the steps of:
    using an adhesive to affix the thermal spreader to the die pad; and
    forming the thermal spreader as part of the die pad prior to placing the integrated circuit in the package.

* * * * *